(12) United States Patent
Tervonen et al.

(10) Patent No.: US 7,042,371 B2
(45) Date of Patent: May 9, 2006

(54) OPTICAL KEYBOARD WITH GEODESIC OPTICAL ELEMENTS

(75) Inventors: Ari Tervonen, Vantaa (FI); Markku A. Oksanen, Helsinki (FI)

(73) Assignee: Nokia Corporation, Espoo (FI)

( * ) Notice: Subject to any disclaimer, the term of this patent is extended or adjusted under 35 U.S.C. 154(b) by 295 days.

(21) Appl. No.: 10/786,570

(22) Filed: Feb. 24, 2004

(65) Prior Publication Data

US 2005/0184885 A1    Aug. 25, 2005

(51) Int. Cl.
*H03M 11/00* (2006.01)
(52) U.S. Cl. .......................... 341/31; 250/229; 358/19
(58) Field of Classification Search .................. 341/20, 341/22, 31; 250/229; 385/19
See application file for complete search history.

(56) References Cited

U.S. PATENT DOCUMENTS

| | | | | |
|---|---|---|---|---|
| 4,521,683 A | * | 6/1985 | Miller .......................... 250/221 |
| 4,599,908 A | * | 7/1986 | Sheridan et al. ........ 73/862.046 |
| 4,617,461 A | * | 10/1986 | Subbarao et al. ............ 250/229 |
| 4,641,026 A | * | 2/1987 | Garcia, Jr. ................... 250/229 |
| 4,726,646 A | * | 2/1988 | Tanaka et al. ................. 385/19 |
| 4,786,797 A | * | 11/1988 | Ely ........................... 250/214 R |
| 4,829,165 A | * | 5/1989 | Kalawsky .................... 235/375 |
| 4,836,636 A | * | 6/1989 | Obara et al. ................... 385/19 |
| 4,884,073 A | * | 11/1989 | Souloumiac .................. 341/31 |
| 4,931,794 A | * | 6/1990 | Haag et al. .................... 341/31 |
| 4,980,685 A | * | 12/1990 | Souloumiac et al. .......... 341/31 |
| 4,990,900 A | * | 2/1991 | Kikuchi ....................... 345/174 |
| 5,410,150 A | * | 4/1995 | Teron et al. ............ 250/227.22 |
| 5,677,688 A | * | 10/1997 | O'Mara et al. ................ 341/31 |
| 6,172,667 B1 | * | 1/2001 | Sayag ......................... 345/175 |
| 6,218,967 B1 | * | 4/2001 | Maula .......................... 341/31 |
| 6,765,193 B1 | * | 7/2004 | Sumriddetchkajorn ...... 250/221 |

* cited by examiner

*Primary Examiner*—Albert K. Wong
(74) *Attorney, Agent, or Firm*—Ware, Fressola, Van Der Sluys & Adolphson LLP

(57) ABSTRACT

An optical keyboard having a plurality of keys formed on a sheet of transparent material used as light guide. Each key is a dome-shaped element such that the light beam launched into one end of the dome-shaped element spreads over at least part of the dome-shaped element and then converges at another end. The intensity of the re-focused light beam at the converging end can be sensed by a photosensor. When a key is pressed, the deformity on the dome-shaped element changes the focusing properties of the key and thus the sensed light intensity. The dome-shaped elements can be used as individual keys or as a group of keys arranged in a two-dimensional matrix.

21 Claims, 5 Drawing Sheets

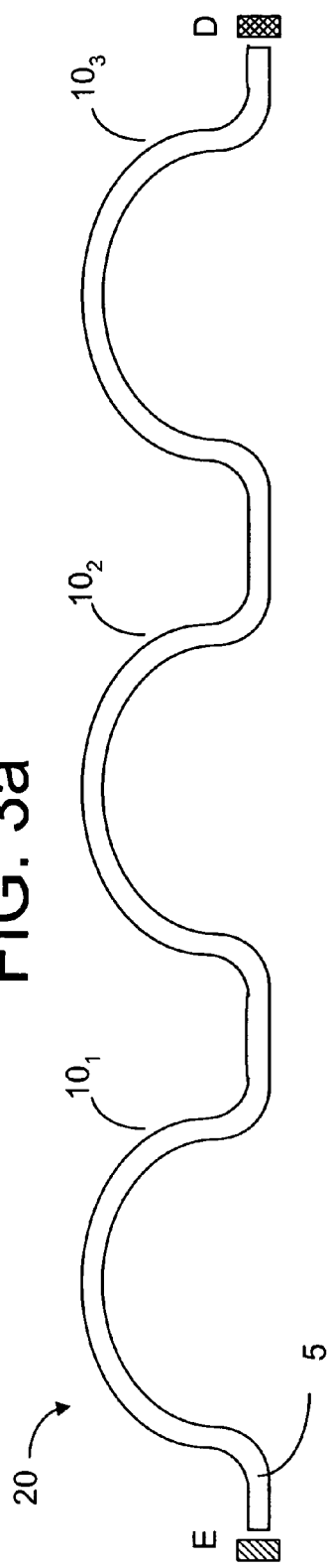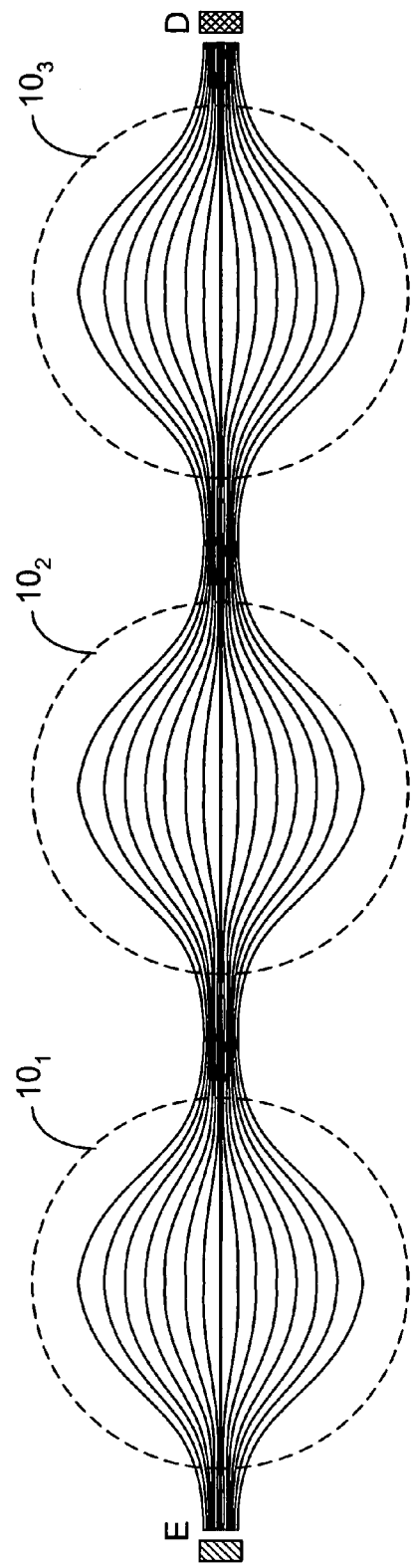

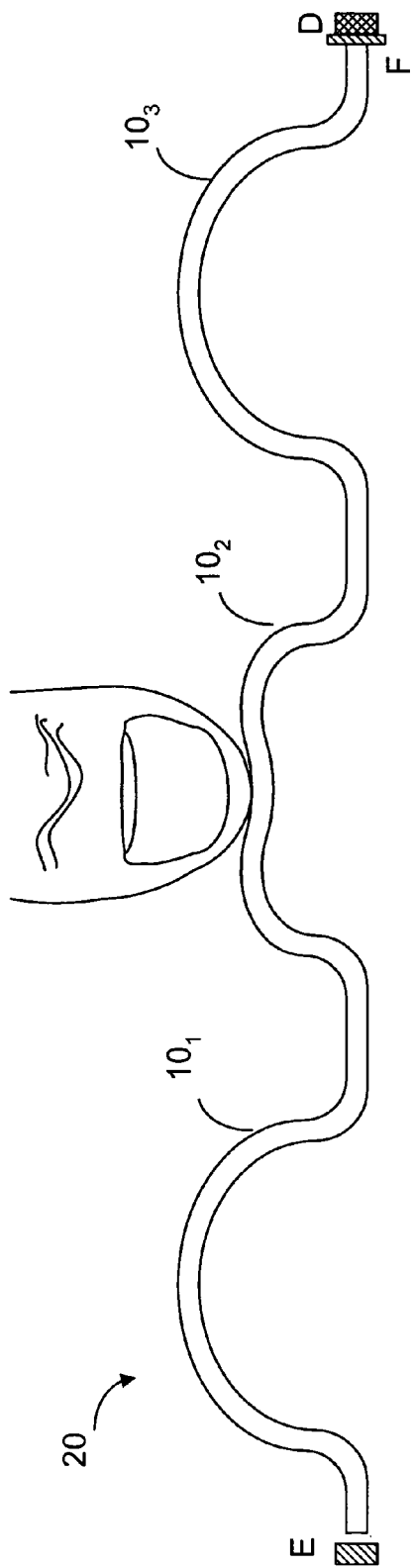

OPTICAL KEYBOARD WITH GEODESIC OPTICAL ELEMENTS

FIELD OF THE INVENTION

The present invention generally relates to a keyboard and, more particularly, to an optical keyboard.

BACKGROUND OF THE INVENTION

A keyboard usually has a plurality of keys to allow a user to enter information or to activate a function in an electronic device by pressing one or more keys on the keyboard. In an electronic keyboard, keys are usually designed to cause an electrical contact in an electronic circuit when a key is pressed. The electric contact causes changes in the current or voltage in the circuit and the changes are sensed electronically in order to determine which key or keys are pressed. Some keyboards are made of optical material so that the legend under the key can be read. Some keyboards are designed so they are also used as light-guides for illumination purposes. However, the keys on those keyboards are also used to cause electrical contacts in the underlying electronic circuit.

It is desirable and advantageous to provide an optical keyboard wherein pressing the keys is mainly for changing the optical parameters of the keys.

SUMMARY OF THE INVENTION

The present invention provides an optical keyboard made of a sheet of optical material for guiding light within the sheet surfaces, wherein one or more geodesic optical elements are formed on the sheets. Each of the geodesic optical elements is basically a dome-like shell. When light is guided or launched onto one end of the dome, the light beam spreads out over a large area of the dome but the spread beam will substantially converge at another end of the dome. But when the dome is deformed, the focusing properties of the dome-shape surface are changed. By sensing the converging beam by an optical sensor, it is possible to detect when the dome is deformed by external pressure. When these geodesic optical elements on the light guide are arranged in N rows and M columns, the light guide can be used as an optical keyboard having N×M keys.

Thus, the first aspect of the present invention provides an optical keyboard for use in an electronic device to allow a user to input information in the electronic device. The optical keyboard comprises:

a light guide; and a plurality of keys of dome-shaped optical elements formed on the light guide, such that light introduced to one end of an optical element spreads over at least a part of the said optical element and then substantially converges at another end of said optical element in a focusing pattern, and when said optical element is deformed by external pressure, the deformity changes the focusing pattern at the other end.

According to the present invention, the optical keyboard further comprises:

one or more light sources, disposed in relation to the keys, for providing light to the optical elements, and a plurality of photosensors, disposed in relation to at least some of the converging ends of the keys, for sensing light intensity of said converging ends of the corresponding optical elements according to the focusing pattern.

According to the present invention, the plurality of keys comprises one or more individual keys and each of the individual keys is associated with one of the light sources, which provides light to said individual key, and one of the photosensors for sensing light intensity at the converging end of said individual key.

According to the present invention, the plurality of keys comprises a group of keys arranged in a two-dimensional matrix having n columns and m rows, with n and m being positive integers, each of the n columns and m rows of keys is associated with one of the light sources disposed at one end of said column or row for providing light to the keys in said column or row, and one of the photosensors disposed at another end of said column or row for sensing light intensity.

The light guide can be a sheet of optical material, or the light guide comprises:

a first sheet of optical material having a first refractive index, and a second sheet of optical material laminated to the first sheet, the second sheet of optical material having a second refractive index substantially lower than the first refractive index. The light guide may also comprise:

a first sheet of optical material having a first refractive index, a second sheet of optical material laminated to one side of the first sheet, and a third sheet of optical material laminated to another side of the first sheet, wherein the second sheet of optical material has a second refractive index substantially lower then the first refractive index, and the third sheet of optical material has a third refractive index substantially lower than the first refractive index.

Alternatively, the light guide comprises:

a sheet of optical material having a first refractive index, and wherein one or both sides of the sheet are coated with a coating material having a second refractive index substantially lower to the first refractive index.

According to the present invention, the optical keyboard further comprises one or more optical filters disposed in relation to the photosensors for filtering out ambient light reaching the photosensors.

The second aspect of the present invention provides an electronic device comprising:

an optical keyboard having a plurality of keys to allow a user to input information in the electronic device by pressing one or more keys, wherein the keys are dome-shaped optical elements such that light introduced to one end of a key spreads over at least a part of the corresponding optical element and then substantially converges at another end of the key;

one or more light sources, disposed in relation to the keys, for providing light to the keys; and a plurality of photosensors, disposed in relation to at least some of the converging ends of the keys, for sensing light intensity at said converging ends of the keys, wherein when one or more of the keys are pressed, deforming the dome-shaped optical elements of the pressed keys, the sensed light intensity is caused to change due to the deformity.

According to the present invention, the plurality of keys comprises one or more individual keys and each of the individual keys is associated with one of the light sources, which provides light to said individual key, and one of the photosensors for sensing light intensity at the converging end of said individual key.

According to the present invention, the plurality of keys comprises a group of keys arranged in a two-dimensional matrix having n columns and m rows, with n and m being positive integers, each of the n columns and m rows of keys is associated with one of the light sources disposed at one end of said column or row for providing light to the keys in said column or row, and one of the photosensors disposed at another end of said column or row for sensing light intensity.

The dome-shaped optical elements can be formed on a sheet of optical material.

The dome-shaped optical elements can be formed on a first sheet of optical material having a first refractive index, and wherein the sheet is laminated to a second sheet of optical material having a second refractive index, which is substantially lower than the first refractive index.

The dome-shaped optical elements can be formed on a first sheet of optical material having a first refractive index, and wherein the sheet is laminated between a second sheet of optical material having a second refractive index and a third sheet of optical material having a third refractive index, the second and third refractive indices being substantially lower than the first refractive index.

The dome-shaped optical elements can be formed on a sheet of optical material having a first refractive index, and wherein one or both sides of the sheet are coated with a coating having a second refractive index substantially lower to the first refractive index.

The keyboard may further comprises one or more optical filters disposed in relation to the photosensors for filtering out ambient light reaching the photosensors.

According to the present invention, the light sources comprise one or more light-emitting diodes.

The electronic device comprises a mobile terminal, a PDA, a communicator device or the like.

The present invention will become apparent up reading the detailed description taken in conjunction with FIGS. 1 to 7b.

BRIEF DESCRIPTION OF THE DRAWINGS

FIG. 3a is a schematic representation showing a plurality of geodesic optical elements formed on a sheet of transparent material and the associated optical sensing elements.

FIG. 3b is a schematic representation showing the focusing properties of a row of geodesic optical elements.

FIG. 3c is a schematic representation showing one of the geodesic optical elements is deformed by being pressed.

FIG. 7a is a schematic representation showing an optical key laminated to or coated with other transparent materials on both sides of the key.

FIG. 7b is a schematic representation showing an optical key laminated to or coated with other transparent material on one side of the key.

DETAILED DESCRIPTION OF THE INVENTION

The term "geodesic" describes the geometry of curved surfaces in which geodesic lines take the place of the straight line of plane geometry. Geodesic line is the shortest line lying on a given surface and connecting two points. On a spherical surface, a geodesic line is any section of a circular line that goes around the full width of the spherical surface.

Figure 1:
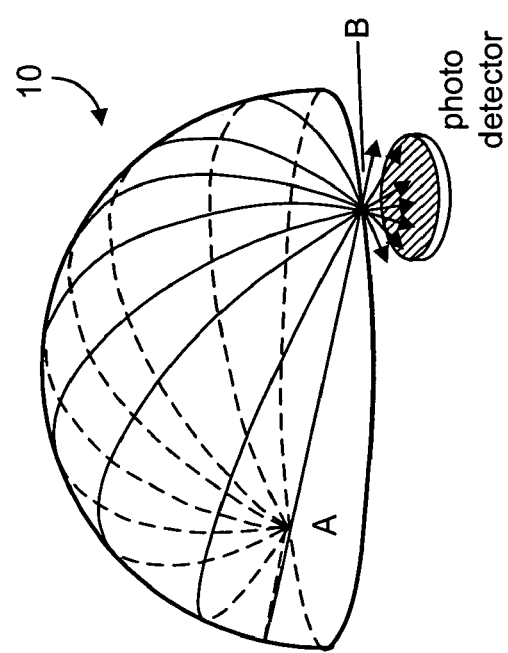
FIG. 1 is a schematic representation showing the focusing properties of a dome-like optical element.

The optical keyboard of the present invention uses a sheet of optical material, such as a transparent plastic, as a light guide so that light launched into the sheet propagates substantially between the two air-interfaces of the sheet. The sheet is formed with a plurality of dome-shaped elements, each of which can be used as a key. When such a dome-shaped element is used as a single key, a light source, such as an LED, is used to launch a light beam into one end of the element and a photosensor is used to detect the change in the converged or focused light beam on another end. As shown in FIG. 1, the light beam launched into the dome-shaped element 10 at point A spreads over dome surface but will substantially converge at point B. A photosensor can be disposed near point B to measure the intensity of the focused beam.

Figure 2A:
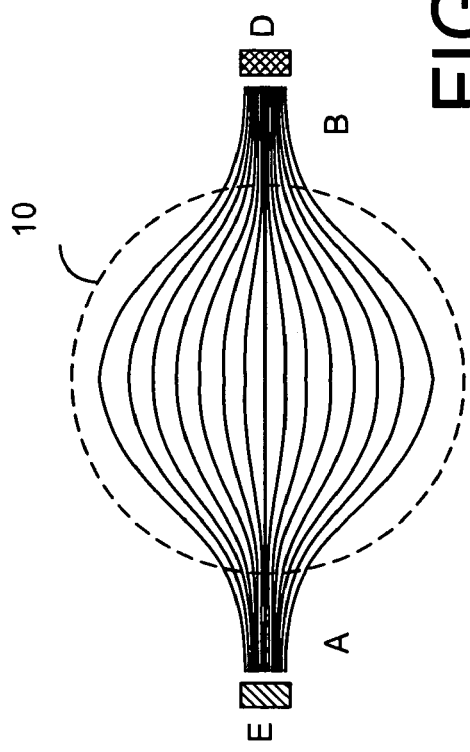
FIG. 2a is a schematic representation showing a light source and an optical sensor are used in conjunction with a geodesic optical element.
Figure 2B:
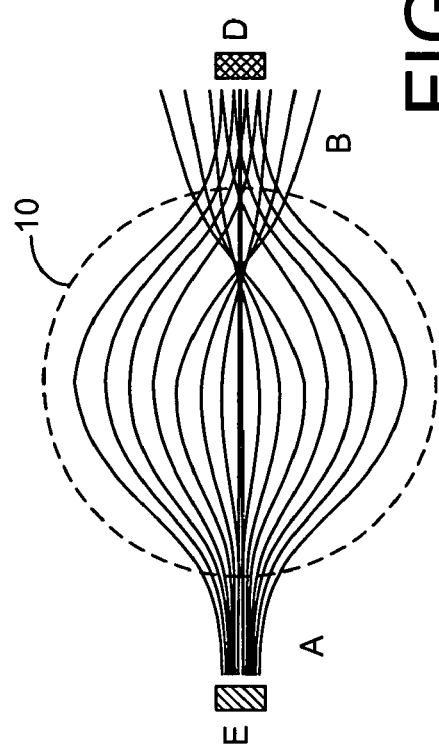
FIG. 2b is a schematic representation showing the changes in the focusing properties when the geodesic optical element is deformed by external pressure.

Schematically, the light focusing properties of the dome-shaped element are shown in FIG. 2a. As shown in the figure, at least part of the light emitted by the light source E is spread and then focused by the dome-shaped element 10. The focused intensity is sensed by the photosensor D. If the dome-shaped element 10 is deformed by external pressure, such as when the dome surface is pressed, part of the focused beam may spread out near the photosensor D, resulting in the reduction of light intensity. Accordingly, the photosensor D can be used to detect whether the dome surface is pressed. The changes in the focusing properties of the dome-shaped element are illustrated in FIG. 2b.

A string of dome-shaped elements 10 can be used as a row of keys, as shown in FIG. 3a, which schematically shows a cross section of the keyboard. As shown in FIG. 3a, a single light source E is used to launch a light beam into a light guide 5, which has three dome-shaped elements $10_1$, $10_2$ and $10_3$. A single photosensor D is used to detect the focused beam near the last element. The focusing properties of the light guide 5 are schematically shown in FIG. 3b. Ideally, the light beam emitted from the light source E is successively spread and focused by the dome-shaped elements. If any one of the dome-shaped elements is deformed by external pressure, as shown in FIG. 3c, the change in the light intensity can be detected by the photosensor D. The change in the light intensity may depend on which of the three elements are deformed and also on the degree of deformity. Thus, it may be difficult to determine which of the keys in a row is pressed.

Figure 4:
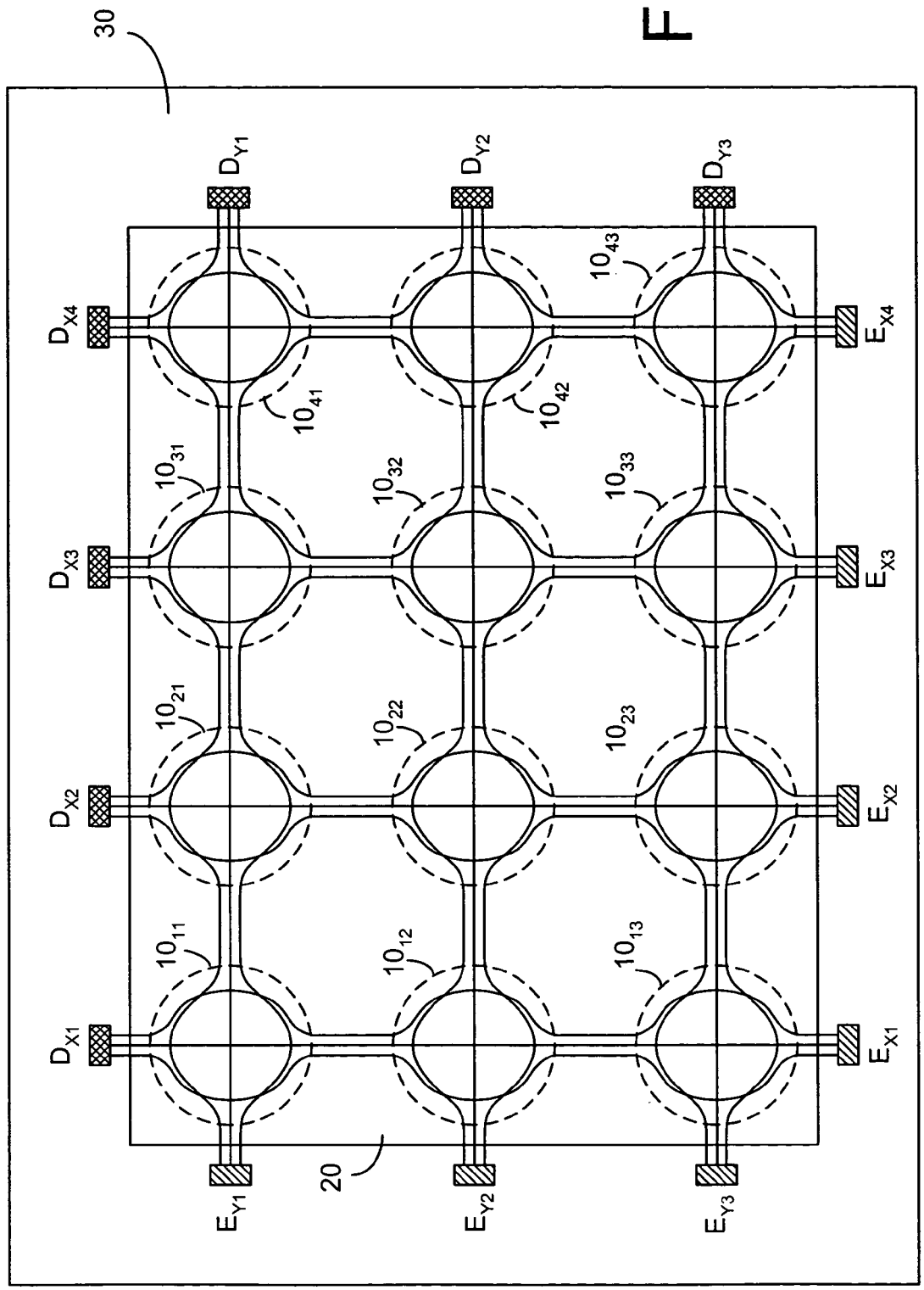
FIG. 4 is a schematic representation showing an optical keyboard, according to the present invention.

According to the present invention, a plurality of rows of dome-shaped elements and a plurality of columns of dome-shaped elements can be used to form an optical keyboard with N×M keys. As schematically shown in FIG. 4, the keyboard 30 comprises a light guiding sheet 20, on which three rows and four columns of dome-shaped elements $10_{11}$, $10_{12}$, . . . , $10_{33}$, $10_{34}$ form twelve keys. Each of the rows and columns is associated with a light source and a photosensor. If one of the dome surfaces ($10_{23}$, for example) is deformed by external pressure, the changes in the light intensity in the corresponding row and column can be detected by photosensors $D_{x2}$ and $D_{y3}$.

Figure 5:
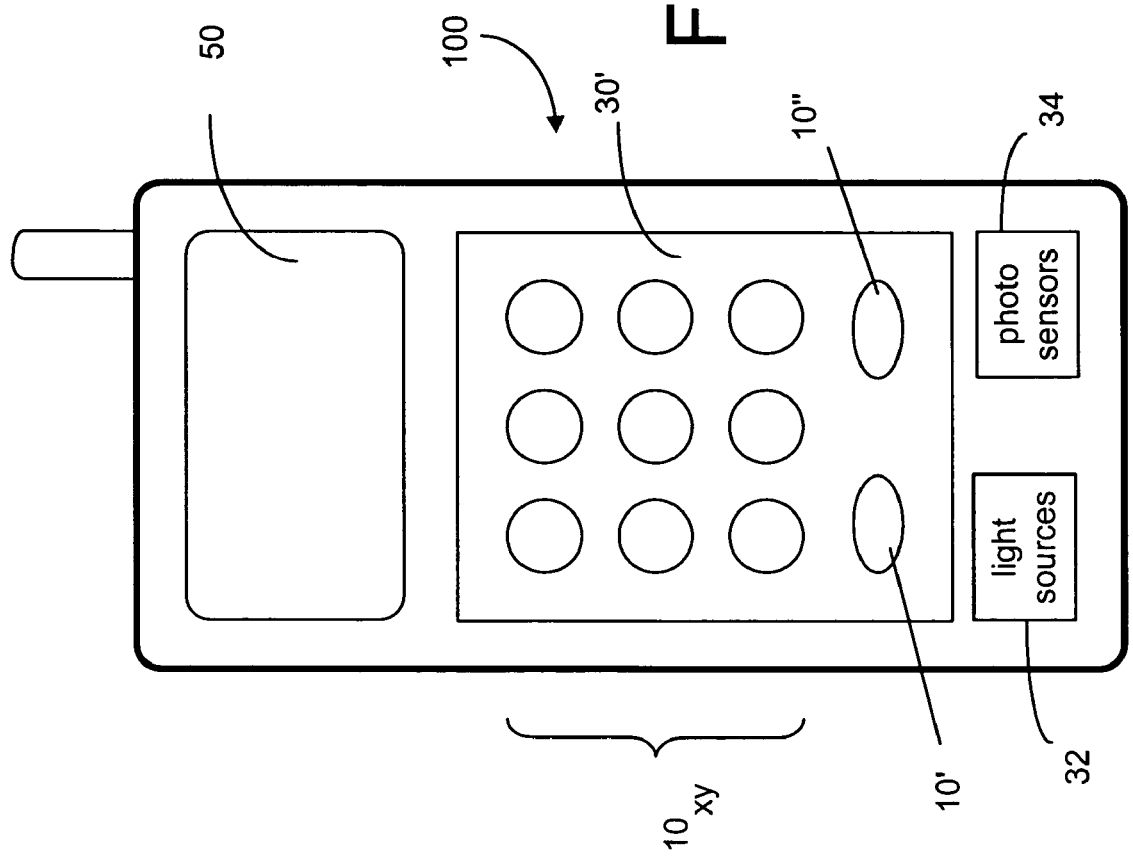
FIG. 5 is a schematic representation showing an electronic device having an optical keyboard, according to the present invention.

FIG. 5 illustrates an electronic device having an optical keyboard, according to the present invention. As shown, the electronic device 100 has an optical keyboard 30' and a display 50. The device 100 can be a mobile terminal, a personal digital assistant (PDA), a communicator device or the like. The keyboard 30' can have a plurality of keys 10$_{xy}$ arrangement in an N×M matrix, as shown in FIG. 4. It may have one or more individual keys 10', 10" as shown in FIG. 2a. The device 100 may have one or more light sources 32 for providing light to the optical keyboard 30' and a plurality of photosensors 34 for optical sensing. It is understood that the electronic device 100 also comprises an electronic circuit, operatively connected to the photosensors associated with the keyboard 100, for processing the sensing signals from the photosensors in order to determine which key or keys are pressed. The electronic device also comprises at least a power source to power the light sources associated with the keyboard and the electronic circuit. The light sources can be light-emitting diodes (LED) or other solid-state light emitters. The keyboard 30' may have a plurality of optical filters F (see FIG. 3c) disposed at the photosensors to filter out undesirable ambient light, for example.

Figure 6:
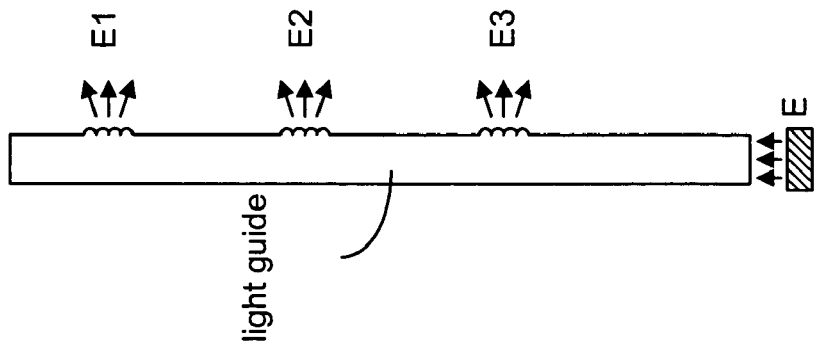
FIG. 6 is a schematic representation showing a plurality of light sources originated from a single light emitting element.

It should be noted that the light sources $E_{Y1}, E_{Y2}, \ldots, E_{X4}$ need not be individual light emitters. Some or all or theses light sources can be light escaping surface elements disposed on a light guide associated with a single light emitter, as shown in FIG. 6.

It should be noted that the dome-shaped elements 10 as shown in FIGS. 3a to 3c are formed on a light guide having two air-interfaces to guide the light beams launched into the light guide. However, the dome-shaped elements can also be formed on a sheet 23 of transparent material (with refractive index $n_2$) laminated between two sheets 22, 24 of other transparent materials (with refractive indices $n_1$ and $n_2$), as shown in FIG. 7a. Because the laminated sheet 20' is used as a light guide, the refractive indices of the sheets 22, 24 must be substantially lower than that of sheet 23, or $n_1 < n_2$, $n_3 < n_2$. As such, the light beams within the sheet 23 substantially propagate between the interfaces 32 and 34. The sheet 22 and sheet 24 can be of the same material ($n_1 = n_3$) or of different materials. Alternatively, the sheet 23 is laminated to only one of the two sheets, as shown in FIG. 7b. Furthermore, FIG. 7a can also be viewed as showing a domed-shaped element 10 coated with materials of substantially lower refractive indices ($n_1 < n_2$, $n_3 < n_2$), or with materials of similar refractive indices ($n_1 = n_2 = n_3$) so long as the coatings do not destroy the focusing properties of the key 10. Again, the sheet 23 can be coated on one side or on both sides, and the coating materials 22, 24 can be different or the same.

Although the invention has been described with respect to preferred embodiments thereof, it will be understood by those skilled in the art that the foregoing and various other changes, omissions and deviations in the form and detail thereof may be made without departing from the scope of this invention.

What is claimed is:

1. An optical keyboard for use in an electronic device to allow a user to input information in the electronic device, said optical keyboard comprising:
   a light guide; and
   a plurality of keys of dome-shaped optical elements formed on the light guide, such that light introduced to one end of an optical element spreads over at least a part of the said optical element and then substantially converges at another end of said optical element in a focusing pattern, and when said optical element is deformed by external pressure, the deformity changes the focusing pattern at the other end.

2. The optical keyboard of claim 1, further comprising:
   one or more light sources, disposed in relation to the keys, for providing light to the optical elements.

3. The optical keyboard of claim 2, further comprising:
   a plurality of photosensors, disposed in relation to at least some of the converging ends of the keys, for sensing light intensity of said converging ends of the corresponding optical elements according to the focusing pattern.

4. The optical keyboard of claim 3, wherein the plurality of keys comprises one or more individual keys and each of the individual keys is associated with
   one of the light sources, which provides light to said individual key, and
   one of the photosensors for sensing light intensity at the converging end of said individual key.

5. The optical keyboard of claim 3, wherein the plurality of keys comprises a group of keys arranged in a two-dimensional matrix having n columns and m rows, with n and m being positive integers, each of the n columns and m rows of keys is associated with
   one of the light sources disposed at one end of said column or row for providing light to the keys in said column or row, and
   one of the photosensors disposed at another end of said column or row for sensing light intensity.

6. The optical keyboard of claim 1, wherein the light guide comprises a sheet of optical material.

7. The optical keyboard of claim 1, wherein the light guide comprises:
   a first sheet of optical material having a first refractive index, and
   a second sheet of optical material laminated to the first sheet, the second sheet of optical material having a second refractive index substantially lower than the first refractive index.

8. The optical keyboard of claim 1, wherein the light guide comprises:
   a first sheet of optical material having a first refractive index,
   a second sheet of optical material laminated to one side of the first sheet, and
   a third sheet of optical material laminated to another side of the first sheet,
wherein the second sheet of optical material has a second refractive index substantially lower then the first refractive index, and the third sheet of optical material has a third refractive index substantially lower than the first refractive index.

9. The optical keyboard of claim 1, wherein the light guide comprises:
   a sheet of optical material having a first refractive index, and wherein one or both sides of the sheet are coated with a coating material having a second refractive index substantially lower to the first refractive index.

10. The optical keyboard of claim 3, further comprising one or more optical filters disposed in relation to the photosensors for filtering out ambient light reaching the photo sensors.

11. The optical keyboard of claim 2, wherein the light sources comprise one or more light-emitting diodes.

12. An electronic device, comprising:
   an optical keyboard having a plurality of keys to allow a user to input information in the electronic device by pressing one or more keys, wherein the keys are dome-shaped optical elements such that light introduced to one end of a key spreads over at least a part of the corresponding optical element and then substantially converges at another end of the key;

one or more light sources, disposed in relation to the keys, for providing light to the keys; and a plurality of photosensors, disposed in relation to at least some of the converging ends of the keys, for sensing light intensity at said converging ends of the keys, wherein when one or more of the keys are pressed, deforming the dome-shaped optical elements of the pressed keys, the sensed light intensity is caused to change due to the deformity.

13. The electronic device of claim 12, wherein the plurality of keys comprises one or more individual keys and each of the individual keys is associated with one of the light sources, which provides light to said individual key, and one of the photosensors for sensing light intensity at the converging end of said individual key.

14. The electronic device of claim 12, wherein the plurality of keys comprises a group of keys arranged in a two-dimensional matrix having n columns and m rows, with n and m being positive integers, each of the n columns and m rows of keys is associated with one of the light sources disposed at one end of said column or row for providing light to the keys in said column or row, and one of the photosensors disposed at another end of said column or row for sensing light intensity.

15. The electronic device of claim 12, wherein the dome-shaped optical elements are formed on a sheet of optical material.

16. The electronic device of claim 12, wherein the dome-shaped optical elements are formed on a first sheet of optical material having a first refractive index, and wherein the sheet is laminated to a second sheet of optical material having a second refractive index, which is substantially lower than the first refractive index.

17. The electronic device of claim 12, wherein the dome-shaped optical elements are formed on a first sheet of optical material having a first refractive index, and wherein the sheet is laminated between a second sheet of optical material having a second refractive index and a third sheet of optical material having a third refractive index, the second and third refractive indices being substantially lower than the first refractive index.

18. The electronic device of claim 12, wherein the dome-shaped optical elements are formed on a sheet of optical material having a first refractive index, and wherein one or both sides of the sheet are coated with a coating having a second refractive index substantially lower to the first refractive index.

19. The electronic device of claim 12, wherein the light sources comprise one or more light-emitting diodes.

20. The electronic device of claim 12, wherein the electronic device comprises a mobile terminal.

21. The electronic device of claim 12, wherein the electronic device comprises a personal digital assistant device.

* * * * *